(12) United States Patent
Kim

(10) Patent No.: US 8,704,225 B2
(45) Date of Patent: Apr. 22, 2014

(54) SEMICONDUCTOR INTEGRATED CIRCUIT

(75) Inventor: Dae Suk Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,263

(22) Filed: Sep. 3, 2012

(65) Prior Publication Data

US 2013/0234139 A1 Sep. 12, 2013

(30) Foreign Application Priority Data

Dec. 16, 2011 (KR) .................. 10-2011-0136547

(51) Int. Cl.
*H01L 29/10* (2006.01)
*H01L 21/70* (2006.01)

(52) U.S. Cl.
USPC ............................................ 257/48; 257/499

(58) Field of Classification Search
CPC ........... H01L 27/0207; H01L 2924/3011; H01L 2924/14; H01L 25/07; H01L 25/18; H01L 25/0657; H01L 22/20
USPC ................ 257/686, E27.07, E27.105
See application file for complete search history.

(56) References Cited

U.S. PATENT DOCUMENTS

| | | | |
|---|---|---|---|
| 2010/0085825 A1* | 4/2010 | Keeth et al. | 365/200 |
| 2011/0006391 A1* | 1/2011 | Lee et al. | 257/529 |
| 2011/0102006 A1* | 5/2011 | Choi et al. | 324/750.3 |
| 2011/0128072 A1* | 6/2011 | Choi et al. | 327/565 |
| 2011/0175639 A1* | 7/2011 | Yoko et al. | 324/762.06 |
| 2011/0242869 A1* | 10/2011 | Lee et al. | 365/51 |
| 2012/0104388 A1* | 5/2012 | Choi et al. | 257/48 |
| 2012/0124532 A1* | 5/2012 | Coteus et al. | 716/104 |

* cited by examiner

*Primary Examiner* — Nikolay Yushin
(74) *Attorney, Agent, or Firm* — William Park & Associates Patent Ltd.

(57) ABSTRACT

A semiconductor integrated circuit includes a plurality of stacked slices each configured to have a plurality of vias formed therein so that signals are transferred between the slices arranged in a vertical direction, wherein each of the plurality of slices is configured to transfer a pulse signal, generated during a test section, to a lowest slice of the plurality of slices through the vias connected thereto.

16 Claims, 7 Drawing Sheets

SEMICONDUCTOR INTEGRATED CIRCUIT

CROSS-REFERENCES TO RELATED APPLICATION

The present application claims priority under 35 U.S.C. §119(a) to Korean application number 10-2011-0136547, filed on Dec. 16, 2011, in the Korean Intellectual Property Office, which is incorporated herein by reference in its entirety.

BACKGROUND

1. Technical Field

The present invention relates to a semiconductor circuit, and more particularly, to a semiconductor integrated circuit.

2. Related Art

As shown in FIG. 1, a known semiconductor integrated circuit 1 is configured in package form by stacking a plurality of slices and coupling the plurality of stacked slices through vias, for example, through silicon vias (TSVs) so that signals may be transferred between the slices.

The lowest slice of the plurality of slices may become a master.

The TSV is a very important element that performs the transfer of a signal between the slices. Accordingly, a via test, which is a test for determining whether the TSV couples different slices electrically, must be performed.

In the known art, the via test is performed on each of the slices Slice1 and Slice2 by using a method comprising of electric current flowing in the TSV through a transistor and measuring the electric current of the master using the monitor pad 11.

The method of measuring an electric current, however, has low reliability in a test because the electric current may change due to several internal and external environmental factors.

If a circuit block 21 (for example, a circuit related to the processing of information for distinguishing slices from one another) is placed between the TSVs as in FIG. 2, the via test itself may be undesirable since an electric current may be blocked or greatly changed by the circuit block 21.

SUMMARY

A semiconductor integrated circuit that enables an efficient and reliable via test to be performed is described herein.

In an embodiment of the present invention, a semiconductor integrated circuit includes a plurality of stacked slices each configured to have a plurality of vias formed therein so that signals are transferred between the slices arranged in a vertical direction, wherein each of the plurality of slices is configured to transfer a pulse signal, generated during a test section, to a lowest slice of the plurality of slices through the vias connected thereto.

In an embodiment of the present invention, a semiconductor integrated circuit includes a plurality of stacked slices each configured to have a plurality of vias formed therein so that signals are transferred between the slices arranged in a vertical direction, wherein each of the plurality of slices is configured to transfer an electric current or a pulse signal to a lowest slice of the plurality of slices through the vias connected thereto during a test section.

In an embodiment of the present invention, a semiconductor integrated circuit includes a plurality of stacked slices each configured to have a plurality of vias formed therein so that signals are transferred between the slices arranged in a vertical direction and a circuit block disposed between two neighboring vias of the plurality of vias, wherein a signal path connected to the two vias is formed within the circuit block, and each of the plurality of slices is configured to generate a pulse signal during each test section, open the signal path, and transfer the pulse signal to a lowest slice of the plurality of slices through the vias connected thereto along the signal path.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to the present invention will be described below with reference to the accompanying drawings through various embodiments.

Figure 1:
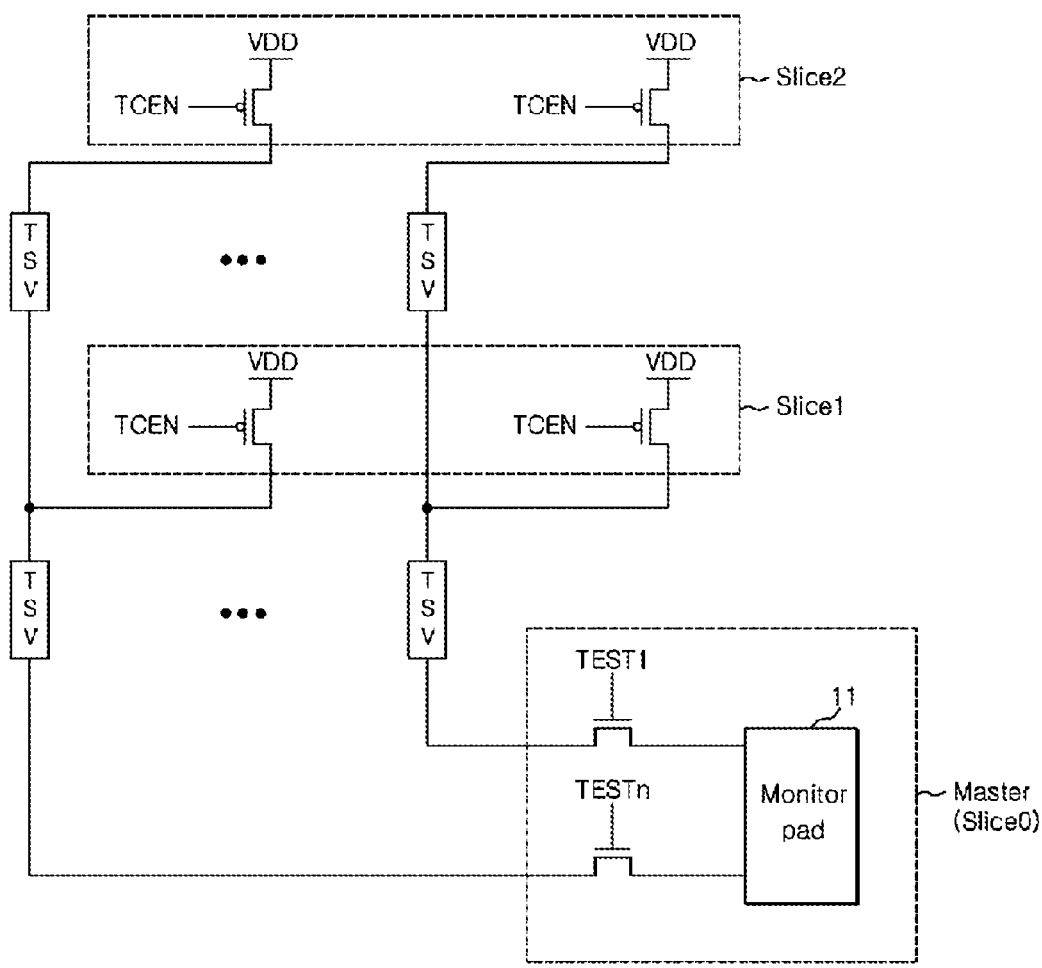
FIG. 1 is a block diagram of a known semiconductor integrated circuit 1.
Figure 2:
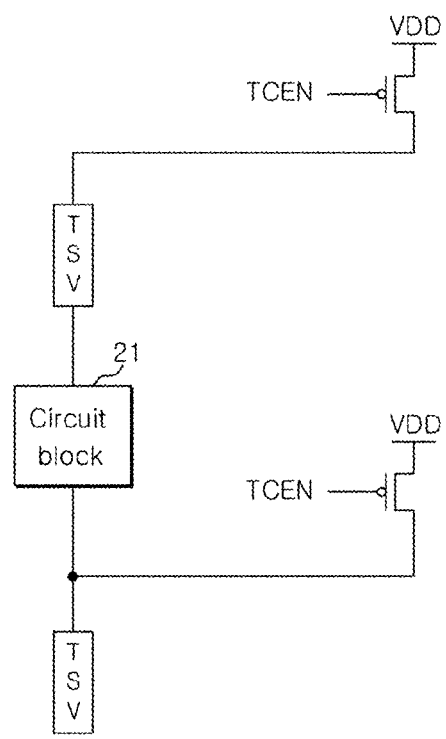
FIG. 2 is a diagram illustrating the addition of a circuit block that prevents an accurate reading of a via test of the known semiconductor integrated circuit 1.
Figure 3:
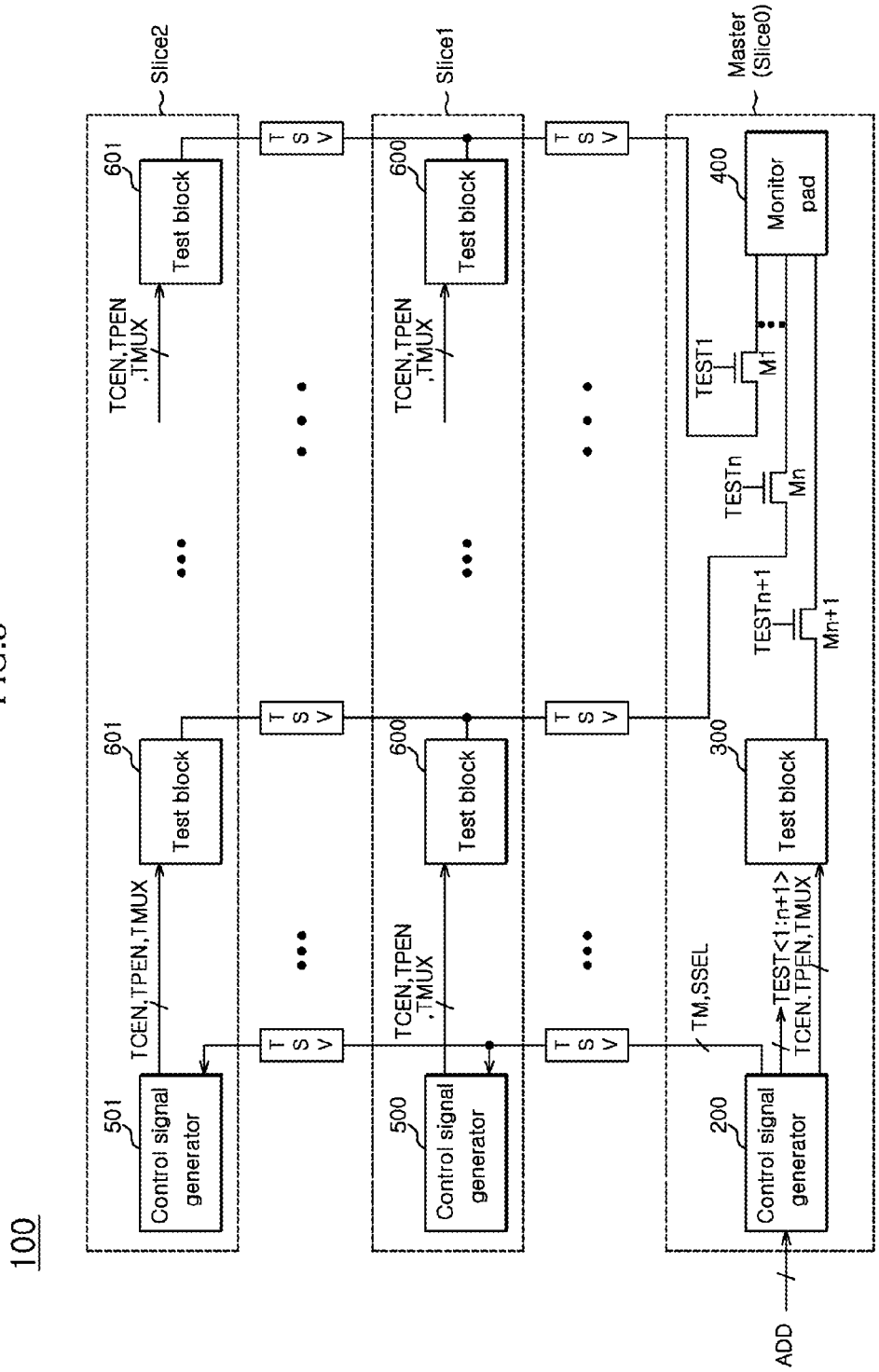
FIG. 3 is a block diagram of a semiconductor integrated circuit 100 according to an embodiment of the present invention.

FIG. 3 is a block diagram of a semiconductor integrated circuit 100 according to an embodiment of the present invention.

As shown in FIG. 3, the semiconductor integrated circuit 100 according to an embodiment of the present invention includes a plurality of slices Slice0~Slice2 electrically coupled through vias, for example, TSVs, so that signals can be transferred between the slices.

In FIG. 3, although it may seem that the vias are placed outside the slices, the figure is exaggerated to show the state of connection between the slices. Practically, the vias are formed to penetrate the slices. Furthermore, the lowest slice, a master, may not need a via because it is placed at the bottom.

From among the plurality of slices Slice0~Slice2, the lowest slice, Slice0, may become a master and the remaining slices, Slice1 and Slice2, may become slaves.

The slice Slice1 is configured to supply an electric current or pulse to vias connected thereto in response to first test control signals supplied from the master, such as a test mode signal TM and a slice selection signal SSEL.

The slice Slice1 includes a control signal generator 500 and a plurality of test blocks 600.

The control signal generator 500 is configured to generate second test control signals, such as a test current enable signal TCEN, a test pulse enable signal TPEN, and a test selection signal TMUX in response to the test mode signal TM and the slice selection signal SSEL.

The slice selection signal SSEL functions to select one of the slices, Slice1 and Slice2.

The test mode signal TM functions to define the activation of a current test mode or the activation of a pulse test mode.

Each of the test blocks 600 is configured to supply an electric current or pulse to vias connected thereto in response to the test current enable signal TCEN, the test pulse enable signal TPEN, and the test selection signal TMUX.

The slice Slice1 includes a control signal generator 501 and a plurality of test blocks 601.

The control signal generator 501 may have the same construction as the control signal generator 500 of the slice Slice1, and the test block 601 may have the same construction as the test block 600 of the slice Slice1.

The master is configured to supply control signals that enable the slices to perform via tests in response to external control and to externally provide a process in which the via tests of the slices are being performed in the form of an electrical signal.

The master includes a control signal generator 200, a test block 300, a monitor pad 400, and a plurality of switches M1~Mn+1.

The control signal generator 200 is configured to generate the test mode signal TM, the slice selection signal SSEL, test count signals TEST<1:n+1>, the test current enable signal TCEN, the test pulse enable signal TPEN, and the test selection signal TMUX in response to an address signal ADD.

The control signal generator 200 may include a shift register for generating the test count signals TEST<1:n+1> and a decoder for generating the test mode signal TM and the slice selection signal SSEL in response to the address signal ADD.

The control signal generator 200 may further include a logic circuit block for generating the test current enable signal TCEN, the test pulse enable signal TPEN, and the test selection signal TMUX.

The test block 300 is configured to model the test blocks 600 and 601 of the slices Slice1 and Slice2 and is connected to the monitor pad 400 without passing through the vias.

The test block 300 is added to monitor a difference between a signal transmission characteristic of the test block 600 connected to the monitor pad 400 through the vias and a signal transmission characteristic of the test block 600 connected to the monitor pad 400 without passing through the vias.

The difference in the signal transmission characteristic includes a electrical load of the via and a difference in the characteristics between the transistor of the slice Slice1 or Slice2 and the transistor of the master.

The monitor pad 400 is used as a terminal for monitoring the via test externally.

Figure 4:
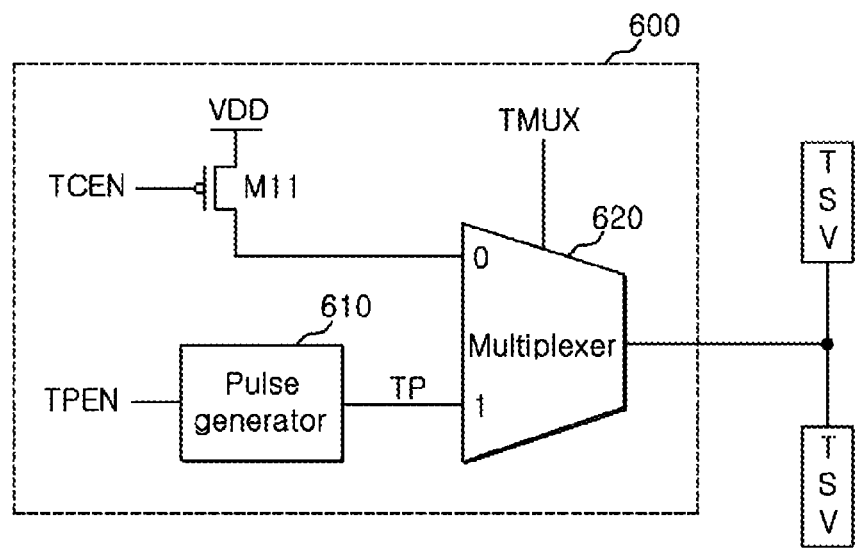
FIG. 4 is a block diagram showing the construction of a test block 600 shown in FIG. 3.

FIG. 4 is a block diagram showing the construction of the test block 600 shown in FIG. 3.

As shown in FIG. 4, the test block 600 includes a transistor M11, a pulse generator 610, and a multiplexer 620.

When the test current enable signal TCEN is activated at a logic low, the transistor M11 connects a power supply terminal VDD with the input terminal 0 of the multiplexer 620.

When the test pulse enable signal TPEN is activated in a logic high, the pulse generator 610 generates a pulse signal TP and provides the pulse signal TP to the input terminal 1 of the multiplexer 620.

The multiplexer 620 connects one of the two input terminals 0 and 1 with the via in response to the test selection signal TMUX.

Figure 5:
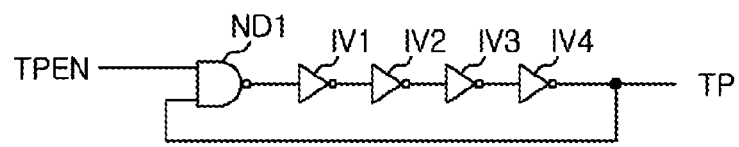
FIG. 5 is a circuit diagram showing the construction of a pulse generator 610 shown in FIG. 4.

FIG. 5 is a circuit diagram showing the construction of the pulse generator 610 shown in FIG. 4.

As shown in FIG. 5, the pulse generator 610 includes a NAND gate ND1 and a plurality of inverters IV1~IV4.

When the pulse enable signal TPEN shifts to a logic high, the pulse generator 610 generates the pulse signal TP.

Figure 6:
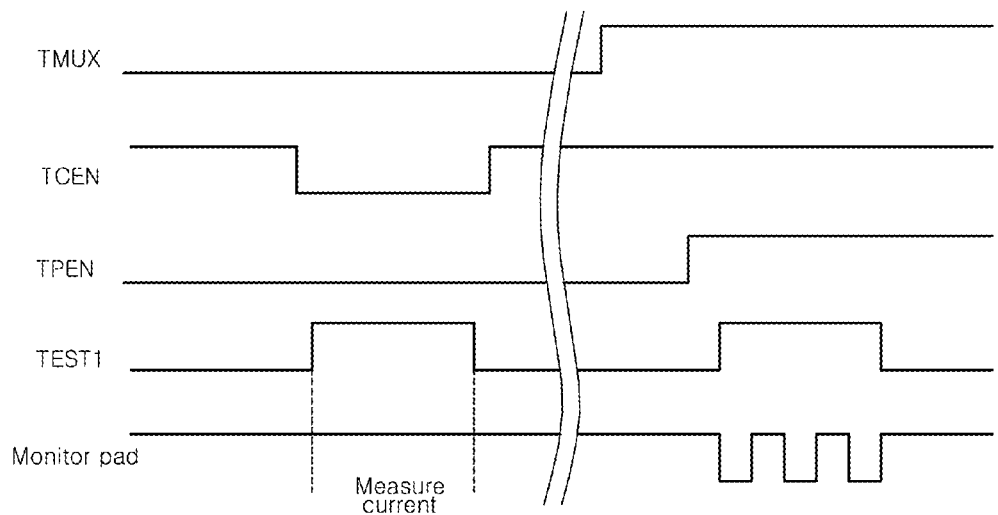
FIG. 6 is an operation timing diagram of the semiconductor integrated circuit 100 according to an embodiment of the present invention.

FIG. 6 is an operation timing diagram of the semiconductor integrated circuit 100 according to an embodiment of the present invention.

A via test method according to an embodiment of the present invention is described below with reference to FIGS. 3 to 6.

In an embodiment of the present invention, a via test may be performed by selecting a pulse method or a current method.

First, the via test may be sequentially performed on the vias connected to the plurality of switches M1~Mn, respectively, on the same line.

Furthermore, the via test may be performed starting from the highest slice, such as slice Slice2 in the embodiment of the present invention, and then performed on the slice Slice1.

For example, a pulse is generated on the slice Slice2. If a logic level of the waveform of the pulse that passes through the vias appears normal on the monitor pad 400, it means that all the vias on the same line are normal. Accordingly, the via test is sequentially performed from the highest slice to a lower slice.

The via test using the current method is first described below.

The control signal generator 200 of the master generates the test mode signal TM to define the current test and the slice selection signal SSEL to define the selection of the slice Slice2, in response to the address signal ADD.

The control signal generator 501 of the slice Slice2 generates the test selection signal TMUX with a logic low, the test current enable signal TCEN with a logic low, and the test pulse enable signal TPEN with a logic low, in response to the test mode signal TM and the slice selection signal SSEL.

All the test blocks 601 supply an electric current to the vias connected therewith.

The control signal generator 200 of the master sequentially activates the test count signals TEST<1:n+1>.

When the test count signal TEST<1> is activated, or in other words, during a logic high section, an electric current passing through all the vias electrically connected to the switch M1 flows through the monitor pad 400.

Likewise, when the test count signals TEST<1: n+1> are activated, tests in all the vias electrically connected to the switches M2~Mn+1 are sequentially performed.

Whether a via is normal or not may be externally determined based on an electric current flowing through the monitor pad 400.

If, as a result of the via test, a via is determined to be abnormal, lower slices may be sequentially selected and a test using the same method as that described above may be performed on the selected lower slices in order to detect the abnormal via.

A via test using the pulse method is described below.

The control signal generator 200 of the master generates the test mode signal TM to define the pulse test and the slice selection signal SSEL to define the selection of the slice Slice2, in response to the address signal ADD.

The control signal generator 501 of the slice Slice2 generates the test selection signal TMUX with a logic high, the test current enable signal TCEN with a logic high, and the test pulse enable signal TPEN with a logic high, in response to the test mode signal TM and the slice selection signal SSEL.

All the test blocks 601 supply repetitive pulse signals to the vias connected therewith.

The control signal generator 200 of the master sequentially activates the test count signals TEST<1:n+1>.

When the test count signal TEST<1> is activated, or in other words, during a logic high section, a pulse signal passing through all the vias electrically connected to the switch M1 is outputted through the monitor pad 400.

Likewise, when the test count signals TEST<1: n+1> are activated, tests in all the vias electrically connected to the switches M2~Mn+1 are sequentially performed.

Whether a via is functioning as expected or not may be externally determined based on the logic level of the pulse signal outputted through the monitor pad 400.

If, as a result of the via test, a via is determined to be abnormal, lower slices may be sequentially selected and a test using the same method as that described above may be performed on the selected lower slices in order to detect the abnormal via.

The control signal generator 500 of an unselected slice Slice1 maintains the test current enable signal TCEN with a logic high and the test pulse enable signal TPEN with a logic low. All the test blocks 600 of the unselected slice Slice1 block an electric current and, at the same time, block the generation of a pulse.

Here, the master is operated so that the test block 300 is operated according to the same method as the known via test method and an output according to the operation is outputted through the monitor pad 400 via the switch Mn+1 when the test count signal TEST<n+1> is activated.

In other words, when the via test using the current method is performed, the test block 300 outputs an electric current. When the via test using the pulse method is performed, the test block 300 outputs pulses.

A change in the electric current of the monitor pad 400 or of a waveform of the pulse signal of the monitor pad 400 when the test count signal TEST<1:n> is activated may be compared with a change in the electric current of the monitor pad 400 or a waveform of the pulse signal of the monitor pad 400 when the test count signal TEST<n+1> is activated externally. A difference between a signal transmission characteristic outputted through the vias and a signal transmission characteristic outputted without passing through the vias may be monitored according to a result of the comparison.

The difference in the signal transmission characteristic includes a a electrical load of the via and a difference in the characteristics of the transistor of the slice Slice1 or Slice1 and the transistor of the master.

Figure 7:
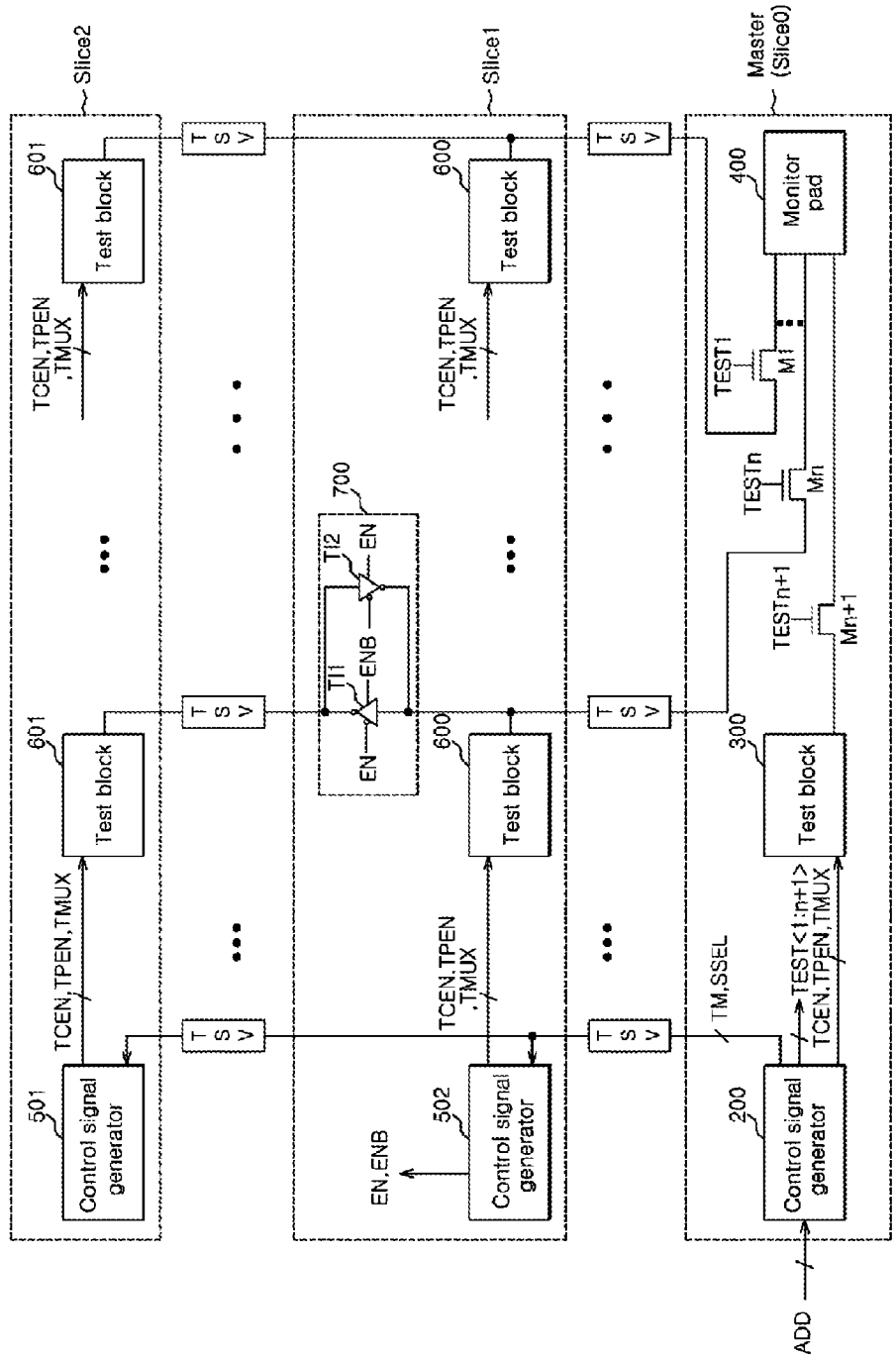
FIG. 7 is a block diagram of a semiconductor integrated circuit 101 according to an embodiment of the present invention.

FIG. 7 is a block diagram of a semiconductor integrated circuit 101 according to an embodiment of the present invention.

As shown in FIG. 7, the semiconductor integrated circuit 101 according to an embodiment of the present invention shows an example in which a circuit block 700 is connected between vias.

FIG. 7 shows an example in which the circuit block 700 is included in a slice Slice1, but one or more circuit blocks 700 may be included between other vias.

The semiconductor integrated circuit 101 according to an embodiment of the present invention may have the same construction as the semiconductor integrated circuit 100 of FIG. 3 other than the circuit block 700 and the control signal generator 502 of a slice including the circuit block 700, for example, the slice Slice1, and thus a description thereof is omitted.

The circuit block 700 includes a circuit (not shown) for performing an inherent function and additional tri-state inverters TI1 and TI2 for forming a signal path through which an electric current or a pulse signal provided from a slice Slice2 passes.

The control signal generator 502 further includes a logic circuit for generating signal path enable signals EN and ENB to control the tri-state inverters TI1 and TI2, as compared with the control signal generator 500 of FIG. 3.

Figure 8:
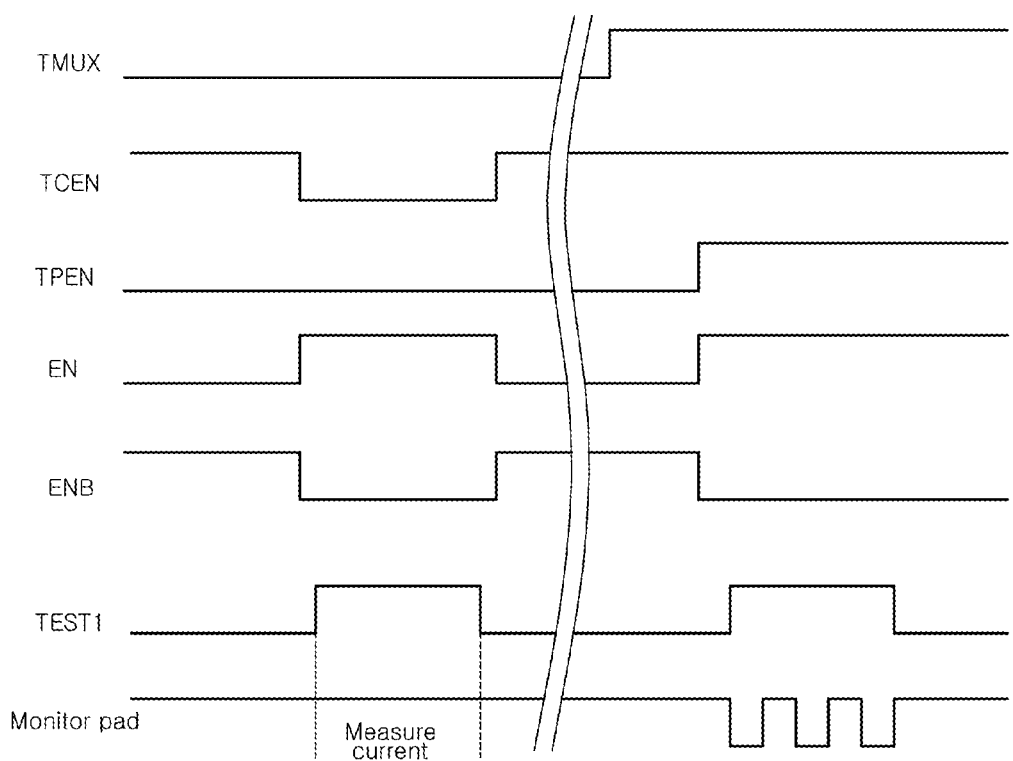
FIG. 8 is an operation timing diagram of the semiconductor integrated circuit 101 according to an embodiment of the present invention.

FIG. 8 is an operation timing diagram of the semiconductor integrated circuit 101 according to an embodiment of the present invention.

The via test method of the semiconductor integrated circuit 101 according to an embodiment of the present invention is similar to the via test method of the semiconductor integrated circuit 100 according to the embodiment of the present invention.

Unlike in FIG. 6, in FIG. 8, the signal path enable signals EN and ENB are activated during each via test section for each of the current and pulse methods.

A signal path ranging from the slice Slice2 to the circuit block 700 of the slice Slice1 is formed. An electric current or pulse signal outputted from the slice Slice2 passes through the vias along the signal path before reaching the monitor pad 400.

In accordance with the embodiments of the present invention, reliability of a via test may be improved due to a logic leveling method being used.

Furthermore, a via test may be performed even if a circuit block is placed between vias.

While certain embodiments have been described above, it will be understood to those skilled in the art that the embodiments described are by way of example only. Accordingly, the semiconductor integrated circuit described herein should not be limited based on the described embodiments. Rather, the semiconductor integrated circuit described herein should only be limited in light of the claims that follow when taken in conjunction with the above description and accompanying drawings.

What is claimed is:

1. A semiconductor integrated circuit, comprising:
a plurality of slices each configured to have a plurality of vias formed therein so that signals are transferred between slices arranged in a vertical direction,
wherein a slice of the plurality of slices is configured to provide a slice selection signal to other slices of the plurality of slices, each of the other slices is configured to generate a pulse signal in response to the slice selection signal and transfer the pulse signal to the slice through the vias connected thereto.

2. The semiconductor integrated circuit according to claim 1, wherein the slice is configured to control a test operation on the plurality of slices in response to an external control and to externally supply the pulse signal transferred via the plurality of vias.

3. The semiconductor integrated circuit according to claim 2, wherein the slice is configured in response to an address signal as the external control.

4. The semiconductor integrated circuit according to claim 1, wherein each of the plurality of slices comprises:
a control signal generator configured to generate a test pulse enable signal in response to the slice selection signal and a test mode signal; and
test blocks each configured to generate the pulse signal in response to the test pulse enable signal and to supply the generated pulse signal to the vias connected thereto.

5. The semiconductor integrated circuit according to claim 1, wherein the slice comprises:

a control signal generator configured to generate a test mode signal and the slice selection signal in response to an address signal; and a monitor pad configured to externally output pulse signals received through the plurality of vias.

6. A semiconductor integrated circuit, comprising:

a plurality of slices each configured to have a plurality of vias formed therein so that signals are transferred between slices arranged in a vertical direction, wherein a slice of the plurality of slices is configured to provide a slice selection signal to other slices of the plurality of slices, each of the other slices is configured to generate a pulse signal or an electric current in response to the slice selection signal and transfer the pulse signal or the electric current to the slice through the vias connected thereto.

7. The semiconductor integrated circuit according to claim 6, wherein the slice is configured to control a test operation on the plurality of slices in response to an external control and to externally supply the electric current or the pulse signal transferred via the plurality of vias.

8. The semiconductor integrated circuit according to claim 7, wherein the slice is configured in response to an address signal as the external control.

9. The semiconductor integrated circuit according to claim 6, wherein each of the plurality of slices comprises:

a control signal generator configured to generate a test current enable signal or a test pulse enable signal in response to the slice selection signal and a test mode signal; and test blocks each configured to supply the electric current to the via connected thereto in response to the test current enable signal or to supply the pulse signal to the via connected thereto in response to the test pulse enable signal.

10. The semiconductor integrated circuit according to claim 9, wherein the test block comprises:

a multiplexer configured to connect one of two input terminals with the via;

a switch configured to connect a power supply terminal with one of the two input terminals in response to the test current enable signal; and a pulse generator configured to generate the pulse signal in response to the test pulse enable signal and to output the pulse signal to the other input of the two input terminals.

11. The semiconductor integrated circuit according to claim 6, wherein the lowest slice comprises:

a control signal generator configured to generate a test mode signal and the slice selection signal in response to an address signal; and a monitor pad configured to externally output electric currents or pulse signals received through the plurality of vias.

12. A semiconductor integrated circuit, comprising:

a plurality of slices each configured to have a plurality of vias formed therein so that signals are transferred between slices arranged in a vertical direction; and a circuit block coupled between two neighboring vias of the plurality of vias, and including an inherent function block and additional signal path for passing a pulse signal through the two neighboring vias;

wherein a slice of the plurality of slices is configured to provide a slice selection signal and a test mode signal to other slices of the plurality of slices, each of the other slices is configured to generate a pulse signal in response to the slice selection signal, open the additional signal path in response to the slice selection signal and the test mode signal, and transfer the pulse signal to the slice through the vias connected thereto.

13. The semiconductor integrated circuit according to claim 12, wherein the inherent function block is configured for processing of information for distinguishing the slices from one another.

14. The semiconductor integrated circuit according to claim 12, wherein the slice is configured to generate the test mode signal in response to an address signal.

15. The semiconductor integrated circuit according to claim 12, wherein each of the plurality of slices comprises:

a control signal generator configured to generate a test pulse enable signal and a signal for controlling the signal path in response to the slice selection signal and the test mode signal; and test blocks each configured to generate the pulse signal in response to the test pulse enable signal and to supply the generated pulse signal to the via connected thereto.

16. The semiconductor integrated circuit according to claim 12, wherein the slice comprises:

a control signal generator configured to generate the test mode signal and the slice selection signal in response to an address signal; and a monitor pad configured to externally output pulse signals received through the plurality of vias.

* * * * *